United States Patent [19]

Dyment et al.

[11] 4,284,884
[45] Aug. 18, 1981

[54] ELECTRO-OPTIC DEVICES

[75] Inventors: John C. Dyment, Kanata; Jozef Straus, Ottawa; Tibor F. I. Kovats, Ottawa; William J. Sinclair, Ottawa; Anthony J. Springthorpe, Richmond, all of Canada

[73] Assignee: Northern Telecom Limited, Montreal, Canada

[21] Appl. No.: 138,747

[22] Filed: Apr. 9, 1980

[51] Int. Cl.³ .............................................. G02B 27/00
[52] U.S. Cl. ........................................ 250/205; 357/19
[58] Field of Search ................. 250/205, 551; 357/19

[56] References Cited
U.S. PATENT DOCUMENTS 4,125,777  11/1978  O'Brien et al. ....................... 250/551

Primary Examiner—David C. Nelms
Assistant Examiner—Darwin R. Hostetter
Attorney, Agent, or Firm—Stuart L. Wilkinson

[57] ABSTRACT

An electro-optic device for stabilizing the output level of a Burrus-type light emitting diode (LED) utilizes a photodiode to monitor side emission from an active region of the LED. Side emission closely tracks top emission, which is launched into an output fiber. An electrical analog is derived from the monitored side emission and is applied in a feedback loop to control modulation level or bias current to the LED. In this way, peak optical output (for digital systems) or r.m.s. output and linearity (for analog systems) is stabilized. The monitoring photodiode and the LED may be spatially separate or may form a unitary structure.

18 Claims, 3 Drawing Figures

ELECTRO-OPTIC DEVICES

This invention relates to light emitting diode devices adapted to give stabilized light output.

One of the primary light sources used in fiber optic communications systems is the light emitting diode (LED) which consists essentially of a p-n junction in which injection of current carriers causes electron-hole recombination with an associated spontaneous photon emission when the device is forward biased.

To transmit information, bias current to the LED is modulated by a modulating signal to give a corresponding variation in light output. In order that the light output is an accurate analog of the modulating signal, the LED operating characteristic, i.e. optical output level and linearity (for analog operation) must be stabilized against aging and temperature-related variation.

To stabilize LED output, the output level is monitored and bias current adjusted in order to restore the particular light characteristic of interest.

In the past, monitoring was achieved by tapping a small, predetermined fraction of light from the output fiber. In one method, a tapping fiber is wrapped around and fused with the output fiber. In another method the output fiber is merely sharply bent in order to couple light out of the fiber. In both cases it is found that the light in the monitoring fiber tracks light in the output fiber only to within about 10%. Consequently the level of light launched into the output fiber cannot be accurately assessed.

Since for both of these arrangements light for monitoring purposes is taken from output light propagating along the output fibre, the light output desirable for transmission of information is somewhat decreased. Consequently, for a particular transmission length, greater amplification is required to compensate for the corresponding reduction in signal to noise ratio.

In its broadest aspect, this invention proposes monitoring the level of side emitted light from the active region of a Burrus-type LED the side emission being a predetermined fraction of LED top emission from the active region and thus providing an analog of the top emission. Monitoring means for monitoring the side emission can be spatially separated from the LED or can be integrally fabricated with the LED. In the latter case a forward biased p-n light emitting junction in the LED structure is reverse-biased to function as a light sensitive junction in the monitoring means. The intensity level of LED side emission tracks LED top emission very closely. In a fibre optic system, the Burrus-type LED top emission is normally launched into an output fibre. Side emission, being of an appreciably lower intensity, has hitherto been neglected.

In both of the cases described, an electrical analog of the monitored side emission light is used to modify operating currents directed to the LED. With an appropriate feedback loop, either the peak optical power (for digital systems) or the r.m.s. power (for analog systems) can be stabilized. In addition, for analog systems, the linearity can also be stabilized.

Embodiments of the invention will now be described by way of example with reference to the accompanying drawings in which.

Figure 1:
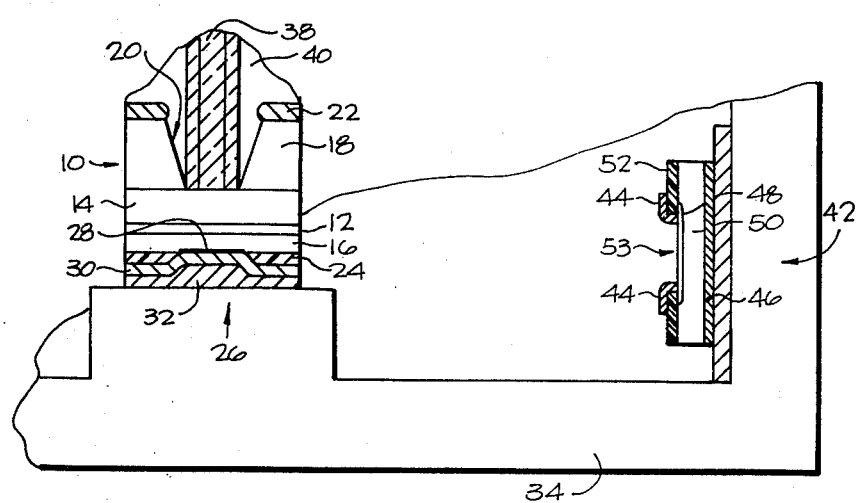
FIG. 1 is a sectional view showing an electro-optic device according to the invention.

Referring firstly to FIG. 1, there is shown a Burrus-type light emitting diode (LED) 10 having a double heterostructure layered construction. A 0.2 to 1 micron active layer 12 of p-type GaAlAs is flanked by a 4 micron confining layer 14 of n-type GaAlAs and a 1.5 micron confining layer 16 of p-type GaAlAs. A substrate layer 18 of n-type GaAs is etched to produce a well 20 extending to the confining layer 14. Over the outer surface of the substrate is deposited a 2500 Å contact layer 22 of Au/Ge. On the undersurface of the confining layer 16 is chemically vapour deposited a $SiO_2$ insulating layer 24 except at a 75 micron diameter window 26 where the exposed confining layer is subjected to a zinc skin diffusion step. The zinc diffused region 28 has a contact layer 30 of 70 Å units of Cr and 2500 Å of Au applied to it. Subsequently, a 5–10 micron gold contact layer 32 is plated over the bottom of the device to function as a heat sink. Connecting leads (not shown) are then soldered to the contact layers 22 and 32.

The LED is mounted against one wall of a hermetically sealed chamber 34 which protects the LED from damaging atmospheric conditions. The connecting leads and an output optical fiber 38, whose end is secured into the well 20 by epoxy 40, exit the chamber 34 through hermetically sealed feedthroughs (not shown) in the chamber walls. When current is directed through the LED via contacts 22 and 32, spontaneous light emission occurs. A major part of this light is emitted perpendicularly to the LED active layer as top emission. Since the top confining layer 14 is very thin, only a small proportion of the top emission is absorbed before the light is launched into the end of optical fibre 38.

The spontaneous emission is emitted in all directions, a portion of the light tending to be guided at the junction plane. Typically, this light travels through over 200 microns mainly along the active layer 12 but also along the confining layers 14 and 16. Consequently a large proportion of the total side emission from the LED active region is absorbed and side emission actually emitted from the LED chip is an order of magnitude less than that available as top emission. As illustrated by J. C. Dyment et al (IEEE Transactions on Electron Devices, Vol. E.D. 24 No. 7, July 1977), typically the top emission ranges from 0–25 mW for a corresponding rise in side emission from 0–800 microwatts with operating current varying from 0–600 mA.

For fibreoptic systems purposes where long lifetime is desired the drive current is usually maintained below 150 mA and it has been ascertained that in the 0–150 mA range, the proportion of side emission to top emission emitted from the LED active region is substantially uniform. In one example, side emission tracked top emission within 1% over the current range of 5 to 150 mA and was within 0.5% over the current range of 50 to 110 mA.

Mounted on another wall of the chamber 34 and spaced from the nearest side surface of the LED 10 is a PIN photodiode 42. The PIN photodiode is of a conventional form having metal contact regions 44 and 46 and n- and p-type silicon semiconductor regions 48 and 50 respectively. The top contact 44 which is separated from p-type region 50 by an oxide layer 52 has a window 53 through which incident photons pass, the photons penetrating to the p-n junction region to render the junction region conducting through electron-hole pair generation when reverse bias is applied. The PIN photo-diode 42 receives light from one face of the LED. As indicated previously, the light intensity provides an accurate analog of output light launched into the fibre 38. If the output of the LED decreases through aging or because of temperature fluctuations, the top emission from the LED is reduced. The monitored light is used to generate a control signal which is applied via a feedback loop to a LED driver circuit to preserve constant optical power output and also to improve linearity.

Figure 2:
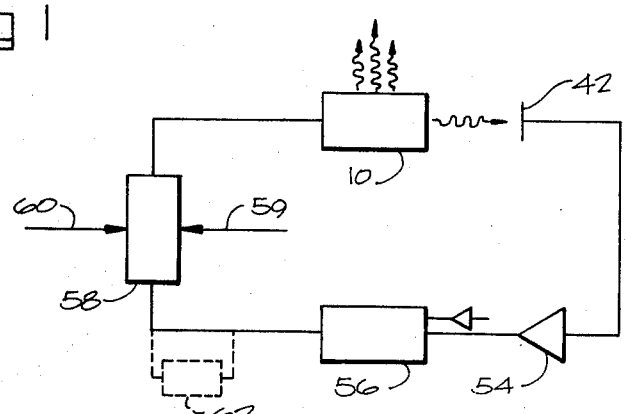
FIG. 2 shows a feedback network for stabilizing LED light output as a function of modulating current.

Referring to FIG. 2, the feedback circuit shows schematically the LED 10 and photodiode 42. Photodiode output is amplified at an amplifier 54 before feeding into a comparator 56 for comparison with a reference voltage corresponding to a preset peak optical power (digital) or r.m.s. optical power (analog). The comparator output is fed to a current generating network 58 for modifying DC bias current 59 or modulation current 60, respectively.

For analog systems, the comparator output can also be fed to an automatic gain control unit 62 (broken line). An LED operating level and corresponding photodiode current are first determined. The gain control unit 62 is then set to apply negative feedback to the current generating network 58 proportional to excursions of the photodiode current output from that operating level. The negative feedback improves linearity so ensuring that output light launched into fibre 38 is a more accurate representation of the impressed AC modulation 60.

Figure 3:
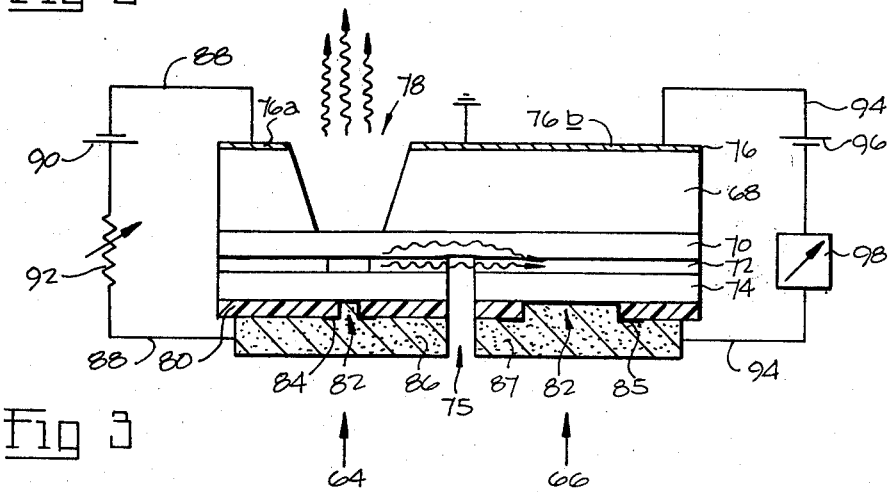
FIG. 3 is a cross sectional view showing a monolithic electro-optic device according to the invention.

Referring now to FIG. 3 there is shown an electro-optic device which is functionally similar to FIG. 1 but in which an LED 64 and a photodiode monitor 66 are fabricated side-by-side as a unitary structure. A particular advantage of this device is that the LED p-n junction is grown simultaneously with, and as an extension of, the photodiode monitoring junction. As shown, a GaAs substrate 68 has epitaxially grown thereon GaAlAs confining and active layers 70, 72 and 74. The chip is formed with a contact layer 76a, 76b, the contact layer and the substrate 68 being etched through to produce a well 78. On a lower surface, a chemically vapour deposited insulating layer 80 of $SiO_2$ is photo-defined to produce windows 82. A Cr/Au contact layer 84 is vacuum deposited through the windows and gold heatsinks 86, 87 are electroplated over the chip lower surface. Leads 88 connect contact 76a and heatsink 86 into an operating current generating circuit shown schematically as current generator 90 and variable resistor 92. Leads 94 connect contact 76b and heatsink 87 into a monitoring circuit shown schematically as battery 96 and signal level indicator 98.

Electrical isolation between the forward biased p-n junction region of the emitter and the reverse biased p-n junction region of the detector is produced by etching a well 75 through to the top confining layer 70.

Although not shown, it will be understood that the output of signal level indicator 98 is used to control a feedback circuit similar to one of those shown in FIG. 2 for stabilizing optical power output level or linearity.

In operation, when a current is directed through the LED 64 via the DC bias generating circuit 90, top emission takes place into the well 78 and side emission propagates through a guiding layer comprising the active layer 74 and adjacent parts of the confining layer 70 and 72. In a p-n junction region above window 82 which is subject to a reverse bias voltage of about 4 to 5 V, incident photons, which are absorbed energize electron-hole pairs in a depletion region causing a current flow which is recorded at the level detector 98. Part of the emitted light impinges on the detector after radiation across the gap between emitter and detector mesas defined by well 75. Further light is guided around the well 75.

In one example of a monolithic emitter-detector fabricated, a current range of between 100 and 200 mA directed through the emitter produced a monitored current of between 50 and 100 microamps at the level detector 98. Tracking was found to be within 1%.

As shown, the detector contact 85 is larger in area than the emitter bottom contact 84 so as to increase the size of the region over which electron-hole pair recombination takes place in the detector. However, a symmetrical device can be fabricated with a detecting section identical with the emitting section shown in FIG. 3. This permits the device to be used as a dual source LED if preferred to an emitter-detector combination device. Although not illustrated, a structure having a single central well can be fabricated characterized by a bottom contact pattern including an internal spot contact for the emitter and an external ring contact for the detector. Some variation from symmetry will be required, in practice, in order to permit soldering of connecting leads and the provision of a heatsink for the emitter.

Although the invention is described in terms of a double heterostructure, it will be clear to those skilled in the semiconductor LED art that single heterostructures or homojunction devices can be fabricated in a similar manner. In addition, although the embodiments described have an LED fabricated from GaAlAs, other III–V compounds can be used.

What is claimed is:

1. An electro-optic device comprising:
   a Burrus-type light emitting diode having an active layer, the light emitting diode being operable to produce primary top emission of light perpendicular to said layer, and relatively low intensity secondary side emission in the plane of said layer;
   drive means for applying current to drive the light emitting diode;
   monitoring means located in the plane of the active layer for monitoring the secondary side emission and for generating an electrical analog of such monitored secondary side emission; and
   feedback means for applying said electrical analog to the drive means whereby to stabilize primary top emission from said light emitting diode.

2. An electro-optic device as claimed in claim 1 in which said monitoring means is a PIN photodiode.

3. An electro-optic device as claimed in claim 2 in which said feedback means comprises a comparator, a difference signal from which comparator is applied to the drive means.

4. An electro-optic device as claimed in claim 2 in which said feedback means comprises a comparator and a gain control unit for introducing negative feedback at said drive means whereby to preserve linearity of light emitting diode output as a function of applied operating current.

5. A method of stabilizing top emission from a Burrus-type light emitting diode in response to an operating current directed through an active region of the light emitting diode, said method comprising monitoring side emission from the light emitting diode in the plane of the active region, generating an electrical analog of said monitored side emission and utilizing said electrical analog to vary the operating current applied to the light emitting diode and thereby stabilize top emission emitted perpendicularly to the active region.

6. A method as claimed in claim 5 in which the electrical analog is compared to a reference level and a corresponding difference signal is applied to a d.c. bias current generating means in order to preserve a predetermined r.m.s. optical ouput level from said light emitting diode when operated in an analog mode.

7. A method as claimed in claim 6 in which the electrical analog drives a gain control unit which unit introduces negative feedback at a modulation current generating means whereby to preserve linearity of light emitting diode output as a function of applied bias current.

8. A method as claimed in claim 5 in which the electrical analog is compared to a reference level and a corresponding difference signal is applied to a pulse modulation current generating means in order to preserve a predetermined peak optical output level from said light emitting diode when operated in an analog mode.

9. An electro-optic device comprising an integrated Burrus-type light emitting diode and a detector, the device having:
  a semiconductor chip having a p-n junction layer;
  the Burrus-type light emitting diode including means for directing an operating current across a first region of the p-n junction to stimulate light emission from said region;
  the detector including means for reverse biasing another region of the p-n junction electrically isolated from said first region for stimulating a detector current across the second region in response to photon emission from the first region incident on the second region;
  the device further comprising feedback means for varying the operating current across the first junction region in response to the detector current whereby to stabilize light output of the Burrus-type light emitting diode.

10. An electro-optic device as claimed in claim 9 in which the Burrus-type LED and the detector have a common grounded top contact and separate bottom contacts for providing respectively forward and negative biasing of said first and second junction regions.

11. An electro-optic device as claimed in claim 10 in which the bottom contacts are generally parallel stripes.

12. An electro-optic device as claimed in claim 11 in which the semiconductor chip overlying the stripe contacts is rendered highly resistive intermediate the stripe contacts.

13. An electro-optic device as claimed in claim 10 in which the chip has an elongate well over the Burrus LED bottom contact, the LED top contact formed on an upper surface of the chip bounding the well.

14. An electro-optic device as claimed in claim 9 in which the detector bottom contact is larger than the emitter bottom contact.

15. An electro-optic device as claimed in claim 9 in which said feedback means comprises a comparator, a difference signal from which comparator is applied to, and controls, an operating current generating means.

16. An electro-optic device as claimed in claim 15 in which the difference signal from the comparator is fed to an automatic gain control unit and the output of said unit controls the output level of a.c. modulation current from said operating current generating means.

17. An electro-optic device as claimed in any of claims 9 to 16 in which the semiconductor is doped gallium aluminum arsenide.

18. An electro-optic device as claimed in any of claims 9 to 16 in which said first and second regions are physically and electrically isolated by an etched well.

* * * * *